(12) United States Patent
Kim et al.

(10) Patent No.: US 8,466,456 B2
(45) Date of Patent: Jun. 18, 2013

(54) ORGANIC LIGHT-EMITTING DISPLAY DEVICE AND METHOD OF MANUFACTURING THE SAME

(75) Inventors: Tae-Woong Kim, Yongin (KR); Sung-Guk An, Yongin (KR); Hyung-Sik Kim, Yongin (KR); Hyung-Woo Koo, Yongin (KR); Dong-Gun Jin, Yongin (KR); Sang-Joon Seo, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 412 days.

(21) Appl. No.: 12/915,438

(22) Filed: Oct. 29, 2010

(65) Prior Publication Data
US 2011/0156062 A1    Jun. 30, 2011

(30) Foreign Application Priority Data
Dec. 24, 2009  (KR) .............................. 2009-131200

(51) Int. Cl.
*H01L 29/08*    (2006.01)
*H01L 51/00*    (2006.01)
*H01L 21/00*    (2006.01)

(52) U.S. Cl.
USPC  257/40; 257/642; 257/E51.001; 257/E51.022; 257/E25.008; 438/28; 438/69; 438/82; 438/99

(58) Field of Classification Search
USPC ................... 257/40, 642, E51.001, E51.022, 257/E25.008; 438/28, 69, 82, 99
See application file for complete search history.

(56) References Cited

U.S. PATENT DOCUMENTS

| 5,686,360 A | 11/1997 | Harvey, III et al. |
| 5,757,126 A | 5/1998 | Harvey, III et al. |

(Continued)

FOREIGN PATENT DOCUMENTS

| JP | 06-111387 | 4/1994 |
| JP | 09-161967 | 6/1997 |

(Continued)

OTHER PUBLICATIONS

Korean Office action issued on Dec. 14, 2011 by KIPO in the corresponding Korean Patent application No. 2009-0131200.

(Continued)

*Primary Examiner* — Long Tran
(74) *Attorney, Agent, or Firm* — Robert E. Bushnell, Esq.

(57) ABSTRACT

An organic light-emitting display device and a method of manufacturing the same. The organic light-emitting display device includes a first film formed of an inorganic material, a second film that is formed of an organic material and formed on the first film, and includes a first surface and a second surface facing each other and lateral surfaces at boundaries of the first surface and the second surface, with the first surface contacting the first film, a third film that is formed of an inorganic material and covers the second surface and lateral surfaces of the second film, with a first sealing region contacting the first film being formed at a boundary between the second film and the third film, an organic light-emitting unit that is disposed on the third film to overlap with the second film, and a fourth film that covers the organic light-emitting unit, with a second sealing region contacting the third film being formed at a boundary of the fourth film. Accordingly, the organic light-emitting display device is protected from water penetration, thereby providing a long life span to the organic light-emitting display device.

14 Claims, 5 Drawing Sheets

U.S. PATENT DOCUMENTS

| | | |
|---|---|---|
| 6,355,125 B1 | 3/2002 | Tahon et al. |
| 7,189,631 B2 | 3/2007 | Yamazaki et al. |
| 2003/0178937 A1 | 9/2003 | Mishima |
| 2004/0219762 A1* | 11/2004 | Shimoda et al. .............. 438/455 |
| 2007/0091062 A1 | 4/2007 | French et al. |
| 2007/0267973 A1* | 11/2007 | Suh .............................. 313/512 |
| 2010/0164377 A1 | 7/2010 | Shimizu et al. |

FOREIGN PATENT DOCUMENTS

| | | |
|---|---|---|
| JP | 2000-073621 | 3/2000 |
| JP | 2002-277859 | 9/2002 |
| JP | 2003-282258 | 10/2003 |
| JP | 2004327402 | 11/2004 |
| JP | 2006-278004 A | 10/2006 |
| JP | 2009037812 | 2/2009 |
| KR | 1020010078229 A | 8/2001 |
| KR | 1020080065210 A | 7/2008 |
| KR | 1020080105048 A | 12/2008 |
| KR | 1020090009335 A | 1/2009 |
| KR | 10-0888148 B1 | 3/2009 |
| WO | 2008-018737 A1 | 2/2008 |

OTHER PUBLICATIONS

Korean Office Action issued by KIPO, dated May 6, 2011, corresponding to Korean Patent Application No. 10-2009-0131200, together with Request for Entry.

* cited by examiner

Laser Beam

ORGANIC LIGHT-EMITTING DISPLAY DEVICE AND METHOD OF MANUFACTURING THE SAME

CLAIM OF PRIORITY

This application makes reference to, incorporates the same herein, and claims all benefits accruing under 35 U.S.C. §119 from an application for ORGANIC LIGHT-EMITTING DISPLAY DEVICE AND METHOD OF MANUFACTURING THE SAME earlier filed in the Korean Intellectual Property Office on Dec. 24, 2009 and there duly assigned Ser. No. 10-2009-0131200.

BACKGROUND OF THE INVENTION

1. Field of the Invention

The present invention relates to organic light-emitting display devices, and more particularly, to flexible organic light-emitting display devices in which the penetration of water is prevented.

2. Description of the Related Art

Organic light-emitting display devices generally have wide viewing angles, high contrast ratios, short response times, and reduced power consumption, and thus may be used across a variety of applications such as personal portable devices (e.g., MP3 players and mobile phones) or large screen displays (e.g., television sets).

An organic light-emitting display device has self-emitting characteristics, and the weight and thickness of the organic light-emitting display device can be reduced since the organic light-emitting display device does not require an additional light source, unlike a liquid crystal display device.

A flexible organic light-emitting display device may be manufactured using a plastic substrate. Since vapor permeability of the plastic substrate is too large, the life span of the organic light-emitting display device may be, however, decreased.

SUMMARY OF THE INVENTION

An aspect of the present invention is to provide an improved organic light-emitting display device and an improved method for manufacturing the same organic light-emitting display device.

Another aspect of the present invention is to provide organic light-emitting display devices and methods of manufacturing the same, in which water penetration is prevented to assure a long life span of the organic light-emitting display device.

According to an aspect of the present invention, there is provided an organic light-emitting display device including a first film which includes an inorganic material, a second film that includes an organic material and is formed on the first film, and includes a first surface and a second surface facing each other and lateral surfaces at boundaries of the first surface and the second surface, with the first surface contacting the first film, a third film that includes an inorganic material and covers the second surface and the lateral surfaces of the second film, with a first sealing region contacting the first film being formed at a boundary between the second film the third film, an organic light-emitting unit that is disposed on the third film to overlap with the second film, and a fourth film that covers the organic light-emitting unit, with a second sealing region contacting the third film being formed at a boundary between the organic light-emitting unit and the fourth film.

According to another aspect of the present invention, there is provided a method for manufacturing an organic light-emitting display device. The method includes forming, on a glass substrate, an auxiliary film comprising an inorganic material, forming, on the auxiliary film, a first film comprising an inorganic material, forming, on the first film, a second film that includes an organic material and includes a first surface and a second surface facing each other and lateral surfaces at boundaries of the first surface and the second surface, with the first surface contacting the first film, forming a third film that includes an inorganic material and covers the second surface and the lateral surfaces of the second film, with a first sealing region contacting it the first film being formed at a boundary between the second film and the third film, forming an organic light-emitting unit that is disposed on the third film to overlap with the second film, forming a fourth film that covers the organic light-emitting unit, with a second sealing region contacting the third film being formed at a boundary between the organic light-emitting unit and the fourth film, and separating the auxiliary film and the first film.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicated the same or similar components, wherein.

DETAILED DESCRIPTION OF THE INVENTION

The present invention will now be described more fully with reference to the accompanying drawings in which exemplary embodiments of the invention are shown.

Figure 1:
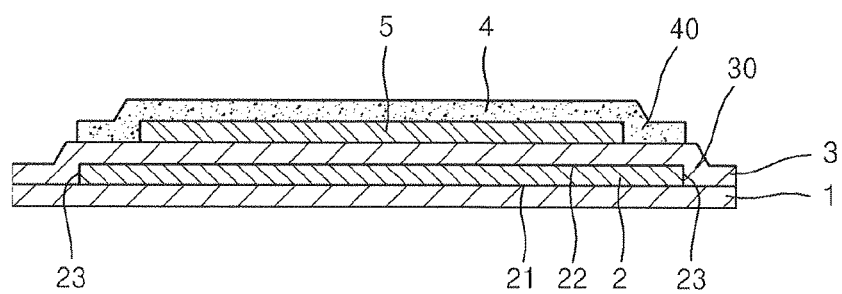
FIG. 1 is a cross-sectional view of an organic light-emitting display device constructed as an embodiment according to the principles of the present invention.

FIG. 1 is a cross-sectional view of an organic light-emitting display device constructed as an embodiment according to the principles of the present invention.

Referring to FIG. 1, the organic light-emitting display device includes a first film 1, a second film 2, a third film 3, an organic light-emitting unit 5, and a fourth film 4.

First film 1 and third film 3 are each formed of an inorganic material. Second film 2 is interposed between first film 1 and third film 3, and is formed of an organic material. Examples of the inorganic material include a silicon oxide, a silicon nitride, and an aluminum oxide. The organic material may be polyimide. First film 1 and third film 3 may be formed of the same material.

Second film 2 is formed on first film 1. Second film 2 has a smaller surface area than that of first film 1 such that a boundary of second film 2 is disposed within the range of first film 1.

Second film 2 includes a first surface 21 and a second surface 22 facing each other and lateral surfaces 23 at boundaries of first surface 21 and second surface 22. First surface 21 of second film 2 contacts first film 1.

Third film 3 covers second surface 22 and lateral surfaces 23 of second film 2. A first sealing region 30 contacting first film 1 is formed at a boundary between second film 2 and third film 3.

As first sealing region 30 of third film 3 contacting first film 1 is disposed outside of second film 2, lateral surfaces 23 of second film 2 are not exposed to the outside.

Organic light-emitting unit 5 is disposed on third film 3 so as to overlap with second film 2. Organic light-emitting unit 5 includes an organic light-emitting diode and forms an image toward first film 1 and/or fourth film 4. A detailed example of organic light-emitting unit 5 will be described later.

Fourth film 4 covers organic light-emitting unit 5, and includes a second sealing region 40, which is formed at a boundary between fourth film 4 and organic light-emitting unit 5, and contacts third film 3. Accordingly, a boundary of organic light-emitting unit 5 is not exposed to outside but sealed.

According to the current embodiment of the present invention, first film 1 and third film 3 each formed of an inorganic material may block water that may penetrate second film 2, and thus water penetration into organic light-emitting unit 5 may be prevented. Moreover, referring to FIG. 1, an inorganic material, an organic material, and an inorganic material are sequentially stacked in the stated order from first film 1, thus forming a complicated path for water and further effectively preventing water penetration.

Also, first film 1 and third film 3 each formed of an inorganic material have high heat resistance, and thus are prevented from rupturing in subsequent thermal processes.

In addition, second film 2 is interposed between first film 1 and third film 3, and thus the same stress is applied to upper and lower surfaces of second film 2. Accordingly, an assembly of first film 1, second film 2, and third film 3 is prevented from bending in a direction either upwards or downwards in FIG. 1 occurred by an unbalance of the stress. The bending may be further prevented if first film 1 and third film 3 are formed of the same material.

Figure 2:
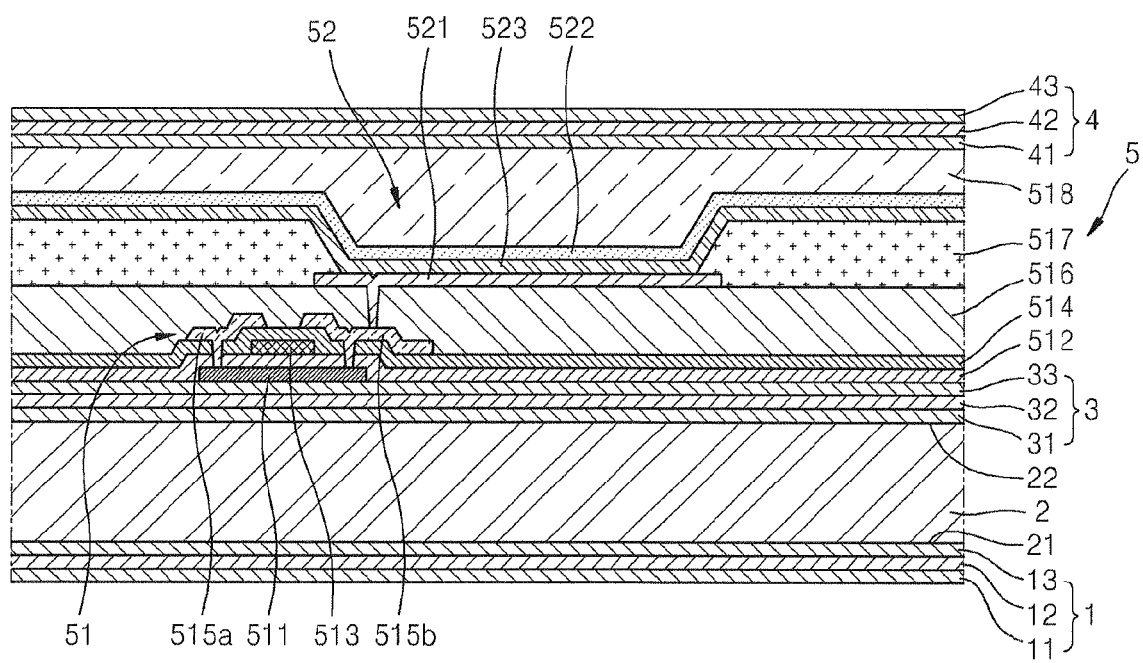
FIG. 2 is a cross-sectional view showing the organic light-emitting display device of FIG. 1 in detail.

FIG. 2 is a cross-sectional view showing the organic light-emitting display device of FIG. 1 in detail.

First, first film 1 may have a structure in which a second layer 12 and a third layer 13 are sequentially stacked in the stated order on a first layer 11. First layer 11 and third layer 13 may be formed of a silicon nitride, and second layer 12 may be formed of a silicon oxide. Obviously, first layer 11 and third layer 13 may also be formed of a silicon oxide, and second layer 12 may be formed of a silicon nitride.

Second film 2 is formed on third layer 13. First surface 21 of second film 2 and third layer 13 of first film 1 contact each other.

Third film 3 is disposed on second surface 22 of second film 2, and may have a structure in which a fifth layer 32 and a sixth layer 33 are sequentially stacked in the stated order on a fourth layer 31. Fourth layer 31 and sixth layer 33 may each be formed of a silicon nitride, and fifth layer 32 may be formed of a silicon oxide. Obviously, fourth layer 31 and sixth layer 33 may also each be formed of a silicon oxide, and fifth layer 32 may be formed of a silicon nitride. Fourth layer 31 of third film 3 contacts second surface 22 of second film 2.

Water penetration may be further prevented using the above-described structure of first film 1 and third film 3.

Organic light-emitting unit 5 is formed on sixth layer 33 of third film 3. Organic light-emitting unit 5 includes a pixel circuit unit including a thin film transistor (TFT) 51 and an organic light-emitting diode 52 that emits light.

According to the organic light-emitting display device of FIG. 2, TFT 51 is formed on sixth layer 33 of third film 3. Although not shown in FIG. 2, a plurality of TFTs 51 may be formed in one pixel, and a capacitor (not shown) may also be formed at the same time when TFTs 51 are formed.

First, a semiconductor active layer 511 is formed on sixth layer 33 of third film 3.

Semiconductor active layer 511 may be formed of amorphous or polycrystalline silicon, but is not limited thereto. For example, semiconductor active layer 511 may be formed of a semiconductor oxide, for example, a G-I-Z-O layer [$(In_2O_3)a(Ga_2O_3)b(ZnO)c$ layer] (where a, b, and c are integers that respectively satisfy $a \geqq 0$, $b \geqq 0$, and $c > 0$).

A gate insulating layer 512 is formed on sixth layer 33 to cover semiconductor active layer 511, and a gate electrode 513 is formed on gate insulating layer 512.

An interlayer insulating layer 514 is formed on gate insulating layer 512 to cover gate electrode 513, and a source electrode 515a and a drain electrode 515b are formed on interlayer insulating layer 514 so as to respectively contact semiconductor active layer 511 via a contact hole.

The structure of TFT 51 is not limited thereto, and any of various types of TFT structures may be employed.

A planarization layer 516 is formed to cover TFT 51. Planarization layer 516 may be a single- or multi-layered insulating film, an upper surface of which is planarized. Planarization layer 516 may be formed of an inorganic material and/or an organic material.

A pixel electrode 521 is formed on planarization layer 516, and is connected to drain electrode 515b of TFT 51 via a via-hole formed in planarization layer 516. In one embodiment, as shown in FIG. 2, pixel electrode 521 is formed in each pixel as an island type independent from one another.

A pixel defining layer 517 covering edges of pixel electrode 521 is formed on planarization layer 516. An organic emission layer 523 and an opposite electrode 522 are sequentially formed in the stated order on pixel electrode 521. Opposite electrode 522 is formed as a common electrode over all of the pixels.

Organic emission layer 523 may be a low-molecular weight organic film or a polymer organic film having a large molecular weight. When organic emission layer 223 is a low-molecular weight organic film, organic emission layer 223 may be formed by stacking a hole injection layer (HIL), a hole transport layer (HTL), an emission layer (EML), an electron transport layer (ETL), and an electron injection layer (EIL) in a single structure or a composite structure, and may be formed of any of various materials such as copper phthalocyanine (CuPc), N,N'-Di(naphthalene-1-yl)-N,N'-diphenyl-benzidine (NPB), or tris-8-hydroxyquinoline aluminum (Alq3). The low-molecular weight organic film may be formed by vacuum deposition. In this regard, the HIL, the HTL, the ETL, and the EIL are common layers and may be commonly applied to red, green, and blue pixels.

In one embodiment, pixel electrode 521 functions as an anode electrode, and opposite electrode 522 functions as a cathode electrode. Obviously, the polarities of pixel electrode 521 and opposite electrode 522 may be reversed.

In a top emission type apparatus in which an image is formed toward opposite electrode 522, pixel electrode 521 may be a reflective electrode and opposite electrode 522 may be a transparent electrode. Pixel electrode 521 may include a reflection film formed of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or a combination thereof, or an oxide having a high work function, such as ITO, IZO, ZnO, or $In_2O_3$. The opposite electrode 522 may be formed as a semi-reflective film including a metal having a low work function, such as Ag, Mg, Al, Pt, Pd, Au, Ni, Nd, Ir, Cr, Li, or Ca.

In a bottom emission type apparatus in which an image is formed toward pixel electrode 521, pixel electrode 521 may be a transparent electrode and opposite electrode 522 may be a reflective electrode. Pixel electrode 521 may be formed of ITO, IZO, ZnO, or $In_2O_3$, and opposite electrode 522 may be formed of Ag, Mg, Al, Pt, Pd, Au, Ni, Nd, Ir, Cr, Li, or Ca.

In a dual emission type apparatus in which images are formed toward pixel electrode 521 and opposite electrode 522, both pixel electrode 521 and opposite electrode 522 may be formed of transparent electrodes.

A passivation layer 518 is finally formed on opposite electrode 522. Passivation layer 518 may be formed of an organic material and/or an inorganic material.

Fourth film 4 is formed on passivation layer 518, and fourth film 4 may be a stack structure including a seventh layer 41, an eighth layer 42, and a ninth layer 43.

Seventh layer 41 and ninth layer 43 may each be formed of an inorganic material such as a silicon oxide or a silicon nitride. Eighth layer 42 may be formed of an organic material such as epoxy or polyimide.

In FIG. 2, fourth film 4 has a three-layer structure including seventh layer 41, eighth layer 42, and ninth layer 43, but is not limited thereto. Fourth film 4 may have a stack structure in which a plurality of inorganic materials and organic materials are alternately stacked, and water hardly penetrates fourth film 4 accordingly.

FIGS. 3A through 3I are cross-sectional views illustrating a method of manufacturing an organic light-emitting display device, as an embodiment according to the principles of the present invention. FIG. 4 is a flow chart illustrating the method for manufacturing the organic light-emitting display device, as the embodiment according to the principles of the present invention.

Hereinafter, a method of manufacturing an organic light-emitting device, according to an embodiment of the present invention, will be described.

Figure 3A:
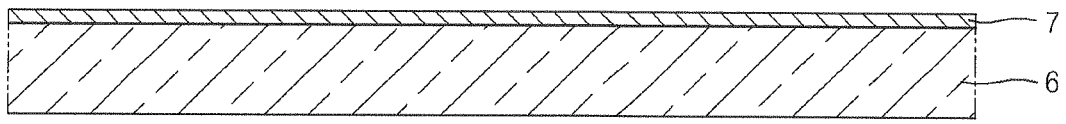
FIGS. 3A through 3I are cross-sectional views of an organic light-emitting display device illustrating a method for manufacturing an organic light-emitting display device, as an embodiment according to the principles of the present invention.
Figure 4:
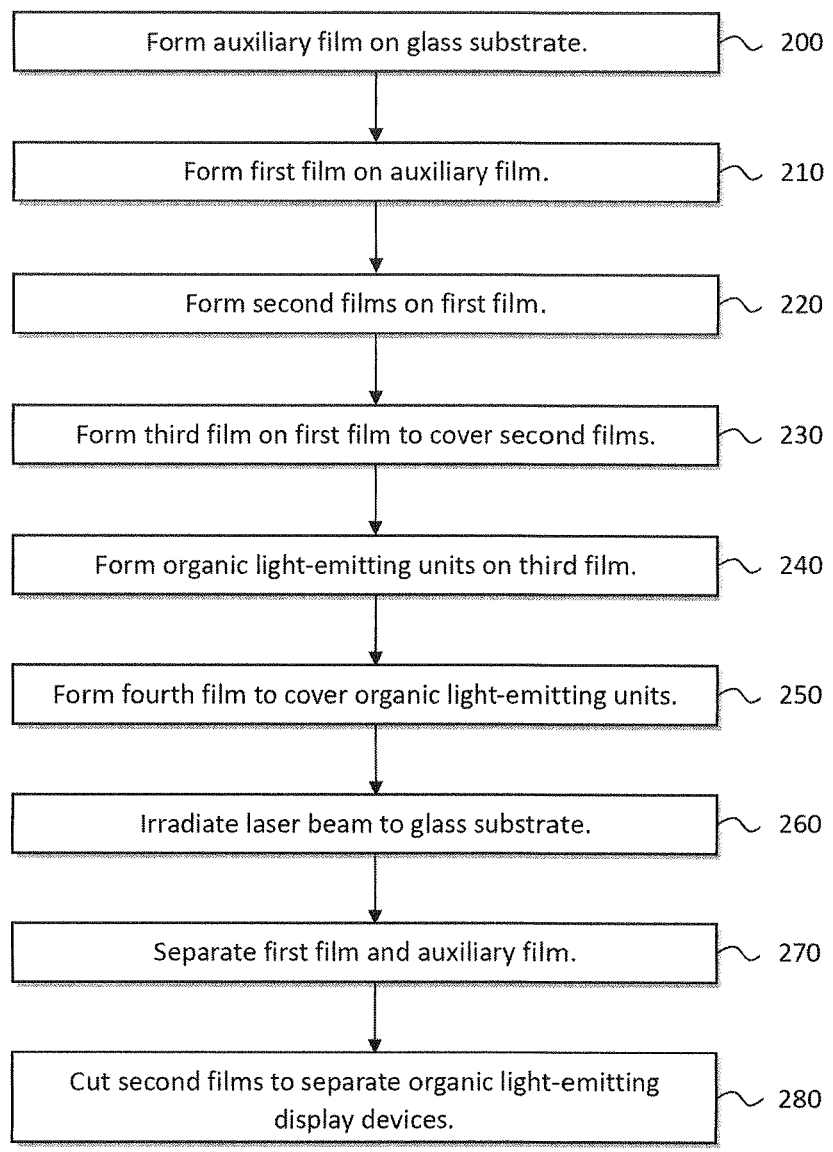
FIG. 4 is a flow chart illustrating the method for manufacturing the organic light-emitting display device, as the embodiment according to the principles of the present invention.

First, referring to FIG. 3A, an auxiliary film 7 is formed on an upper surface of a transparent glass substrate 6 (step 200). Glass substrate 6 may preferably have a predetermined thickness to facilitate handling of glass substrate 6 during the manufacturing process.

Auxiliary film 7 is formed of a material that may be bonded to first film 1 which is to be formed on auxiliary film 7 and that may be easily separated by a laser beam. For example, auxiliary film 7 may be formed of a micro-crystal silicon, titanium or molybdenum.

Figure 3B:
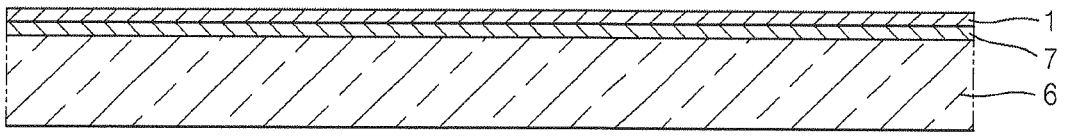

Next, as illustrated in FIG. 3B, first film 1 is formed on auxiliary film 7 (step 210). First film 1 may have a structure in which second layer 12 and third layer 13 are stacked on first layer 11, as illustrated in FIG. 2, and may be formed by deposition using a plasma-enhanced chemical vapor deposition (PECVD) method or an atomic layer deposition (ALD) method.

Figure 3C:
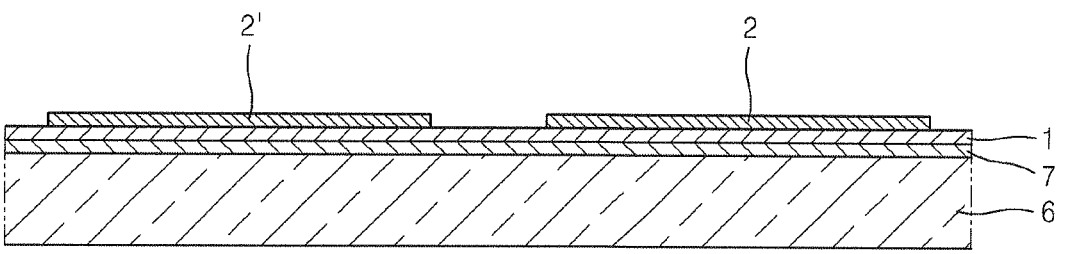

As illustrated in FIG. 3C, second films 2 and 2' are formed on first film 1 (step 220). Second films 2 and 2' may be formed of polyimide, and by using spin-coating, screen printing, or slot die coating.

Second films 2 and 2' may also be formed of various plastic materials other than polyimide. Second films 2 and 2' may be formed of a plastic material that has a thermal expansion coefficient that is similar to a thermal expansion coefficient of glass substrate 6 (about 4 ppm/° C.) or is at least 10 ppm/° C. or less in order to prevent deformation during the manufacturing method.

Referring to FIG. 3C, a plurality of display devices are formed on one glass substrate 6, and here two films 2 and 2' are illustrated on first film 1. The embodiment is, however, not limited thereto, and more display devices than described above may also be formed on first film 1.

Figure 3D:
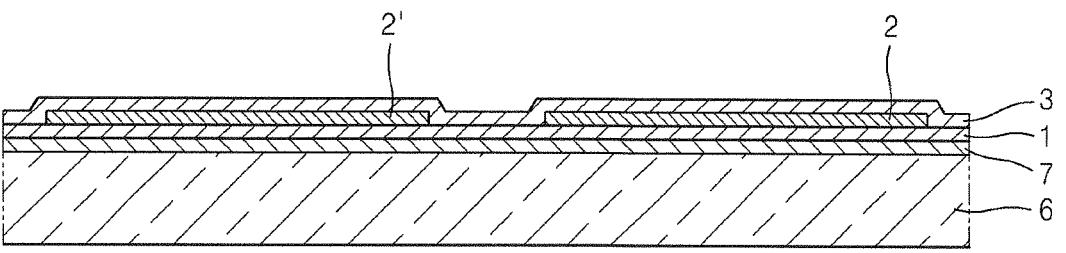

Next, referring to FIG. 3D, a third film 3 is formed on first film 1 to cover second films 2 and 2' (step 230). Third film 3 is formed to completely cover second films 2 and 2' as in the embodiment illustrated in FIG. 1.

Figure 3E:
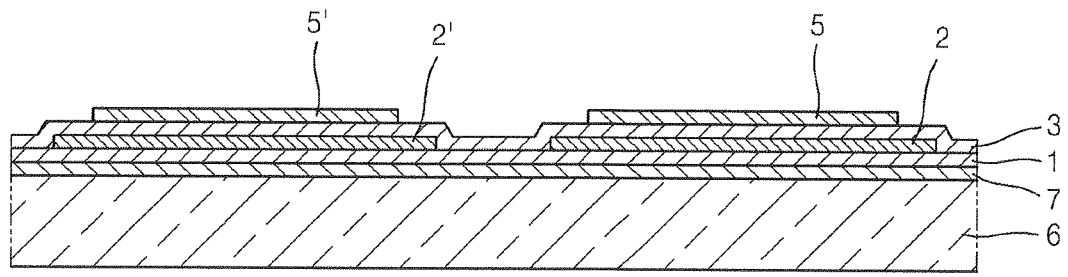

Next, as illustrated in FIG. 3E, organic light-emitting units 5 and 5' are formed on third film 3 (step 240). Organic light-emitting units 5 and 5' are formed on second films 2 and 2' to overlap second films 2 and 2', respectively, and have smaller surface areas than second films 2 and 2' so as not to extend beyond second films 2 and 2'.

Figure 3F:
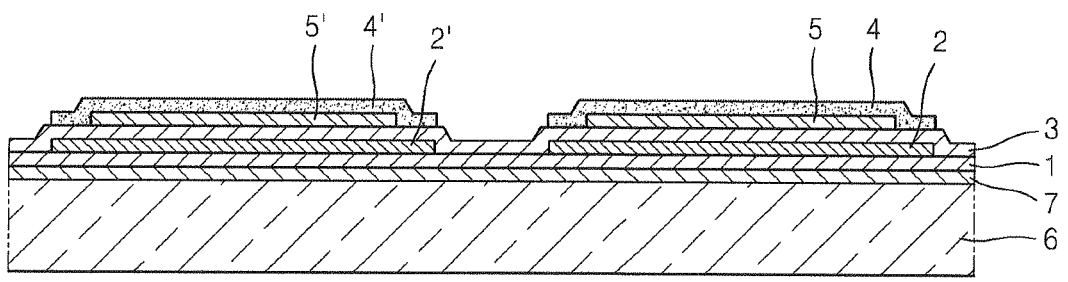

Referring to FIG. 3F, fourth films 4 and 4' are formed to cover organic light-emitting units 5 and 5', respectively (step 250). Fourth films 4 and 4' may be respectively formed to cover organic light-emitting units 5 and 5' as illustrated in FIG. 3F, or may be formed to have a surface area corresponding to first film 1 and third film 3 so as to correspond to the entire surface area of glass substrate 6.

Figure 3G:
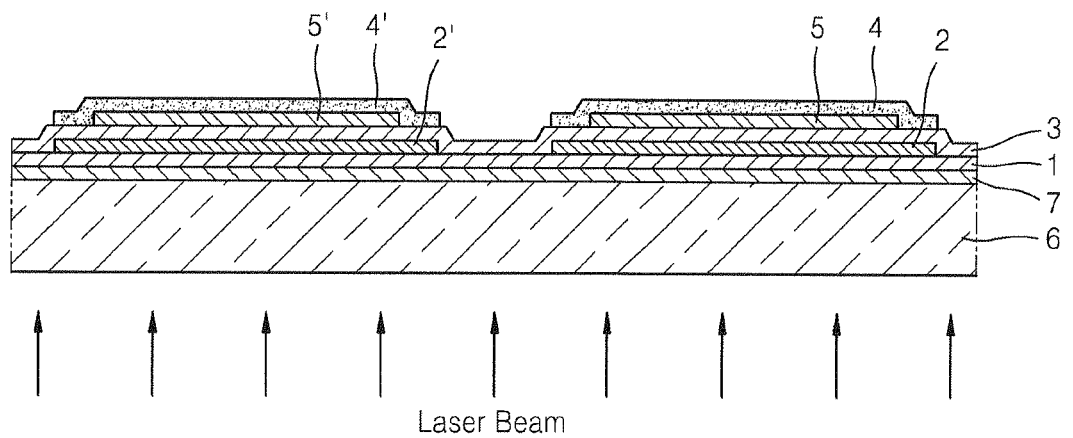
Figure 3H:
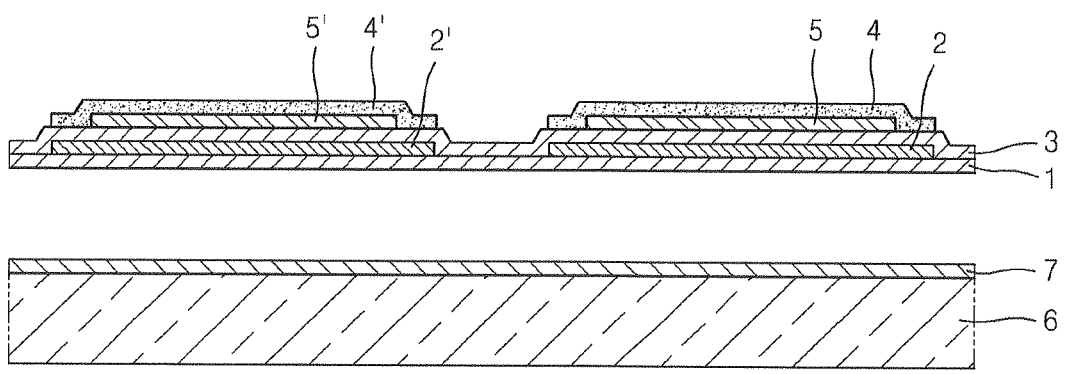

After fourth films 4 and 4' are formed and thus the organic light-emitting display devices is completely sealed, as illustrated in FIG. 3G, a laser beam is irradiated to a lower surface of glass substrate 6 (step 260), so that first film 1 and auxiliary film 7 are separated from each other as illustrated in FIG. 3H (step 270).

The material for forming auxiliary film 7 may be selected according to the type of the laser beam. For example, when a 308 nm Excimer laser is used, auxiliary film 7 may be formed of a microcrystal silicon (uc-Si), titanium, etc. When a 1064 nm Nd:YAg laser is used, auxiliary film 7 may be formed of microcrystal silicon (uc-Si), titanium, molybdenum, etc.

Auxiliary film 7 may maintain an adhesion force between glass substrate 6 and first film 1 while the manufacturing process of the organic light-emitting display devices is performed.

Figure 3I:
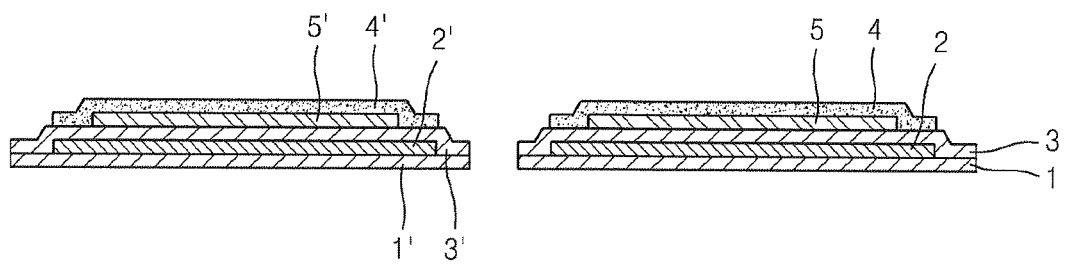

Next, referring to FIG. 3I, second films 2 and 2' are cut along their boundaries to thereby separate respective organic light-emitting display devices (step 280).

As described above, according to the present invention, a flexible organic light-emitting display device having a long life span and increased durability may be manufactured by preventing water penetration.

Also, as the second film is interposed between the first film and the third film, stress due to formation of the first film and third film is offset, thereby preventing bending of the panel.

In addition, the stacked structure of the first through third films extends the path for water, thereby significantly decreasing the water penetration into the substrate.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:
1. An organic light-emitting display device, comprising:
a first film comprising an inorganic material;
a second film that comprises an organic material and is formed on the first film, and comprises a first surface and a second surface facing each other and lateral surfaces at boundaries of the first surface and the second surface, with the first surface contacting the first film;

a third film that comprises an inorganic material and covers the second surface and the lateral surfaces of the second film, with a first sealing region contacting the first film being to located between a boundary of the second film and a boundary of the third film;

an organic light-emitting unit disposed on the third film to overlap with the second film; and a fourth film that covers the organic light-emitting unit, with a second sealing region contacting the third film being located between a boundary of the organic light-emitting unit and a boundary of the fourth film.

2. The organic light-emitting display device of claim 1, wherein the first film and the third film comprise the same material.

3. The organic light-emitting display device of claim 1, wherein at least one of the first film and the third film comprises a plurality of layers, and at least one of the plurality of layers comprises inorganic materials.

4. The organic light-emitting display device of claim 1, wherein the fourth film comprises a layer comprising an inorganic material and a layer comprising an organic material.

5. The organic light-emitting display device of claim 1, wherein the first sealing region is formed to surround the second film.

6. The organic light-emitting display device of claim 1, wherein the second sealing region is formed to surround the organic light-emitting unit.

7. A method of manufacturing an organic light-emitting display device, the method comprising:

forming, on a glass substrate, an auxiliary film comprising an inorganic material;

forming, on the auxiliary film, a first film comprising an inorganic material;

forming, on the first film, a second film that comprises an organic material and includes a first surface and a second surface facing each other and lateral surfaces at boundaries of the first surface and the second surface, with the first surface contacting the first film;

forming a third film that comprises an inorganic material and covers the second surface and the lateral surfaces of the second film, with a first sealing region contacting the first film to being located between a boundary of the second film and a boundary of the third film;

forming an organic light-emitting unit that is disposed on the third film to overlap with the second film;

forming a fourth film that covers the organic light-emitting unit, with a second sealing region contacting the third film being located between a boundary of the organic light-emitting unit and a boundary of the fourth film; and separating the auxiliary film and the first film.

8. The method of claim 7, wherein the first film and the third film comprise the same material.

9. The method of claim 7, wherein at least one of the first film and the third film comprises a plurality of layers, and at least one of the plurality of layers comprises inorganic materials.

10. The method of claim 7, wherein the fourth film comprises a layer comprising an inorganic material and a layer comprising an organic material.

11. The method of claim 7, wherein the first sealing region is formed to surround the second film.

12. The method of claim 7, wherein the second sealing region is formed to surround the organic light-emitting unit.

13. The method of claim 7, wherein the separation of the auxiliary film and the first film comprises irradiating a laser beam from a lower portion of the glass substrate to the auxiliary film.

14. The method of claim 7, wherein the auxiliary film comprises a micro-crystal silicon, titanium, or molybdenum.

* * * * *